United States Patent [19]

Gontowski, Jr. et al.

[11] Patent Number: 4,485,301

[45] Date of Patent: Nov. 27, 1984

[54] LINEAR TWO-TERMINAL INTEGRATED CIRCUIT PHOTO SENSOR

[75] Inventors: Walter S. Gontowski, Jr., Thompson, Conn.; Edward Chalfin, Shrewsbury, Mass.

[73] Assignee: Sprague Electric Company, North Adams, Mass.

[21] Appl. No.: 344,448

[22] Filed: Feb. 1, 1982

[51] Int. Cl.³ .............................................. H01J 40/14
[52] U.S. Cl. ................................ 250/214 A; 307/311; 330/288; 330/308
[58] Field of Search ............ 250/214 P, 214 C, 214 A, 250/214 R; 330/288, 308; 307/311

[56] References Cited

U.S. PATENT DOCUMENTS 4,118,621 10/1978 Monticelli et al. ............. 330/288 X

OTHER PUBLICATIONS

Monticelli, "A Versatile Monolithic IC Building-Block for Light–Sensing Applications"; IEEE Journal of Solid–State Circuits, vol. SC-13, No. 6; Dec. 1978, pp. 873-881.

Primary Examiner—David C. Nelms
Assistant Examiner—Edward P. Westin

[57] ABSTRACT

An integrated circuit includes a principal photo diode connected to the input of a multistage current mirror amplifier. Darlington cascode circuits are integrated into the output branches of the amplifying stages to obviate nonlinear sensitivity of those stages due to Early effect. Each of the cascode circuits have their input base tied to the top end of a diode string through which a current proportional to the photo current is flowing. Thus, there is no DC component in the two supply terminals; in a dark ambient, no supply/signal current flows; and in a light ambient, the supply/signal current is directly proportional to the light intensity.

10 Claims, 5 Drawing Figures

LINEAR TWO-TERMINAL INTEGRATED CIRCUIT PHOTO SENSOR

BACKGROUND OF THE INVENTION

This invention relates to a two-terminal photo sensor including an integrated circuit having a photo diode and a photo current amplifier, and especially relates to such a photo sensor wherein the amplifier exhibits a highly stable gain; i.e. linear sensitivity.

A two terminal integrated circuit is disclosed in the W. Gontowski patent application Ser. No. 296,748, filed Aug. 27, 1981, and assigned to the same assignee as is the present invention. That two terminal photo sensor may be employed in the same basic circuit and in the same way that a simple discrete photo diode 1 would be as illustrated in FIG. 1, e.g. the DC supply 2 is connected in series with the photo diode 1 and a resistor load 3. The current drawn at any time by the two terminal sensor is proportional to the ambient light intensity, and so will be the amplitude of voltage dropped across the load resistor.

It would clearly be advantageous to employ a high voltage supply and a large value resistor to provide a relatively high signal level across the load for a given light level. However, a large signal voltage means a large swing of voltage across the two terminals of the photo sensor. Under these conditions, nonlinearities in photo sensor sensitivity occur that are attributable to Early effect in the output transistors in each current mirror stage. When many such stages are employed, there is a cumulative Early effect that leads to a substantial difference in the photo sensor sensitivity at low light levels relative to the sensitivity at high light levels. In other words the output current (and sensitivity) becomes nonlinear with ambient light level.

The Early effect is normally manifested by the current mirror circuits. That is to say, the output current varies a bit with changes in output voltage. This is because of the slight variation of $V_{BE}$ with collector voltage (typically −0.001 volts per volt).

An exception, however, is the Wilson current mirror circuit, shown in FIG. 2, and further described in U.S. Pat. No. 3,588,672 issued June 28, 1971, that provides good output current stability with load voltage variations. This is achieved by means of a cascode transistor 10 that holds substantially constant the collector voltage of the input transistor 12. Thus the "current-gain" controlling base-emitter junctions of the input transistor 12 and output transistor 15 have a current-density-determined voltage drop that is not subject to a change in the supply voltage, because the collectors of both transistors 12 and 15 are clamped to a low and relatively invarient value. But unfortunately the Wilson current mirror circuit is not suitable for amplification, namely by having disparate "gain controlling" base-emitter junction areas.

It is also known to add a cascode circuit 17 to a simple current mirror circuit 19 as shown in FIG. 3 in order to prevent large swings in amplifier output voltage from affecting the output current 20. The classical cascode circuit of FIG. 4 adds to a grounded emitter amplifier transistor 22 a "grounded base" cascode transistor 24. Here again the Early effect is in fact defeated, although the cascode clamping of the amplifier transistor collector was originally intended to obviate Miller effect, i.e. collector-base capacitance coupling that degrades high frequency performance.

It is an object of the present invention to provide a two-terminal integrated-circuit photo sensor with more stable sensitivity over a wide range of light levels and over a corresponding wide range of signal current levels in the integrated-circuit photo sensor terminals.

It is yet a further object of this invention to provide such a photo sensor that retains its linear response when operating with a low DC supply voltage across the two terminals.

SUMMARY OF THE INVENTION

A two-terminal integrated-circuit photo sensor includes an integrated circuit having a photo diode, a photo-diode-current amplifier of the current mirror type and only two terminals through which the photo sensor is energized and through which the signal current flows. In other words, the current drawn by the photo sensor from a DC voltage power supply is proportional to the light intensity ambient to the photo diode.

A conductive bus means is provided for delivering electrical energy from the two terminal pads to the photo diode and amplifier. A bias current means establishes a current, derived from the two terminal pads, through a string of series-connected diodes, which current is directly proportional to the photo current from the photo diode. A cascode transistor means holds substantially constant the output voltage of at least one current-mirror stage at a level that is directly related to the voltage established across the diode string.

In this way, the branch currents of the current mirror amplifier as well as the diode string bias current are combined in the terminal pads as power supply current that has essentially no DC component and is directly proportional to the ambient light intensity.

It is preferred that the bias current established in the diode string have a smaller amplitude than the signal currents in the output branch of the current mirror stage having the cascode-transistor-means output-voltage control, while at the same time the number of diodes in the string is one more than the number of $V_{BE}$ drops in the cascode transistor means. Thus the level of diode string bias current is less than the level of the signal current in that current-mirror-stage output branch for every particular light intensity. As a result, the "head room", or lowest voltage across the terminal pads for which the circuits operate normally (e.g. transistors are not operating in saturation), can be kept small, as will be further explained. It can be seen that this minimum terminal-pad supply voltage for linear photo sensor operation is one of the key factors limiting the sensitivity that can be achieved in a photo detector system employing a two-terminal integrated circuit photo sensor, since for a given battery voltage the maximum value of load resistance is limited at the highest signal level by the integrated circuit "heat room". That maximum value load resistance determines maximum sensitivity that the system provides (for a fixed output-current to light intensity ratio in the integrated circuit). This limitation is manifested at the highest light level of interest at which the signal currents will be maximum and therefore the PN junction voltage drops will be maximum throughout the integrated circuit.

In a photo sensor of this invention the signal-varying bias-current, driving the diode string, will be established

DESCRIPTION OF THE PREFERRED EMBODIMENT

Figure 1:
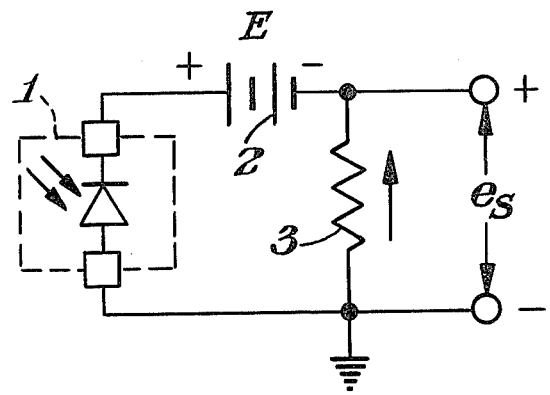
FIG. 1 shows a prior art photo detection circuit for employing a descrete photo diode.
Figure 2:
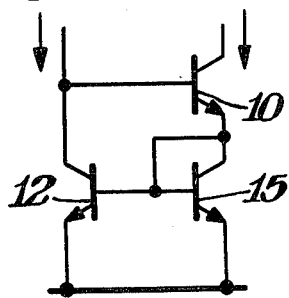
FIG. 2 shows a circuit diagram of a conventional Wilson current mirror.
Figure 3:
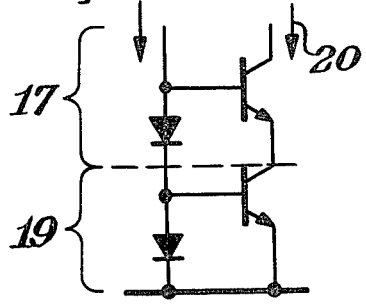
FIG. 3 shows a circuit diagram of a conventional cascode current source.
Figure 4:
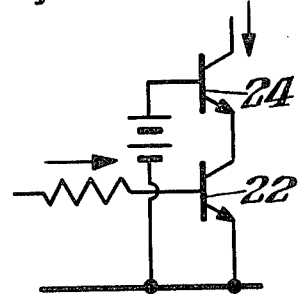
FIG. 4 shows a circuit diagram of a conventional combination of a grounded emitter amplifier and cascode transistor.
Figure 5:
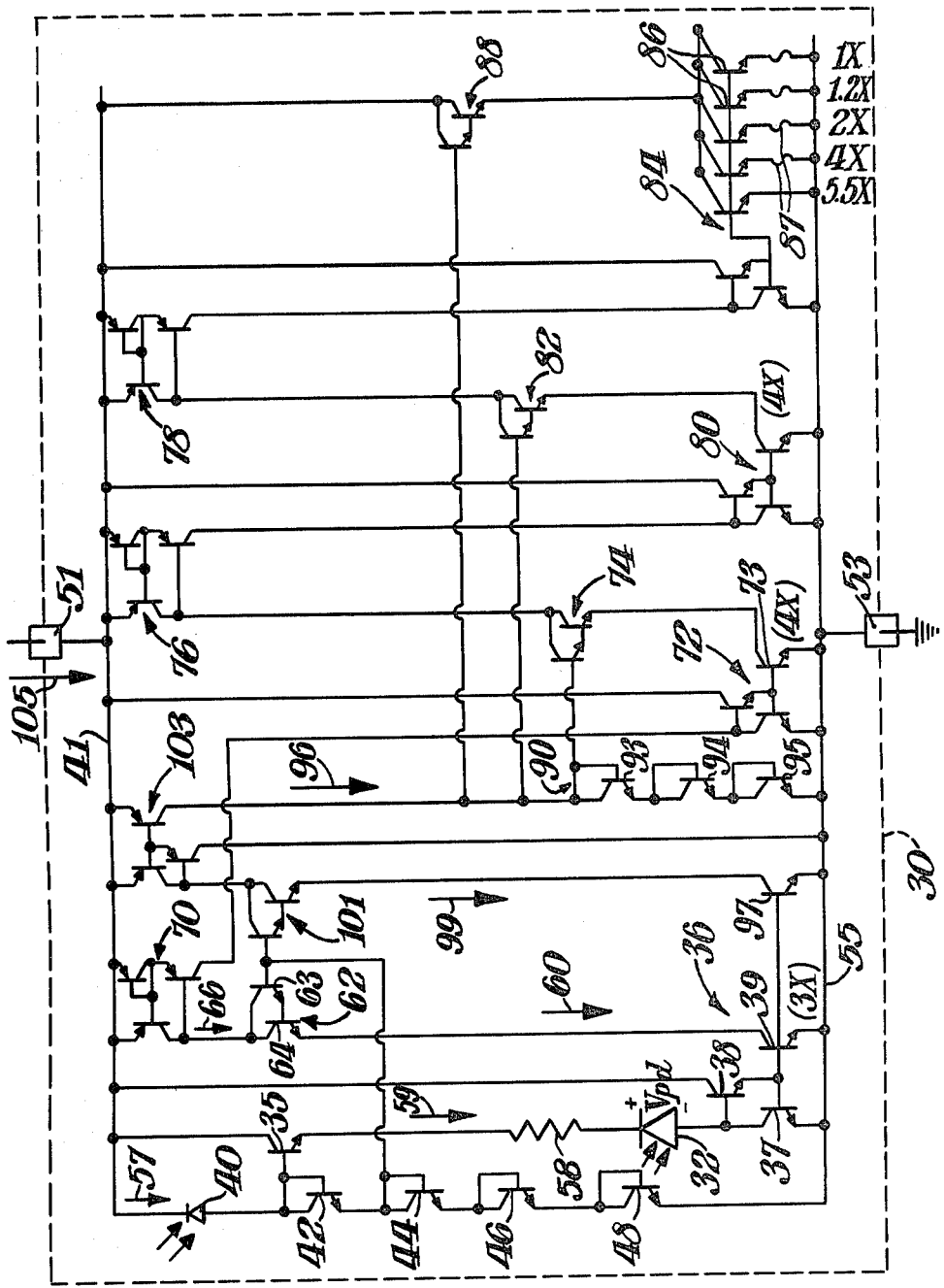
FIG. 5 shows a circuit diagram of a two-terminal photo sensor of this invention.

With reference to the FIG. 5, an integrated circuit 30, includes a photo diode 32 that is connected between the output of an emitter follower, namely transistor 35 and the input of a current mirror amplifier stage 36 consisting of transistors 37, 38 and 39. An auxiliary photo diode 40 of similar size has the cathode connected to the positive DC supply bus 41 and the anode connected to one end of a series string of forward biased diodes 42, 44, 46, and 48. The positive DC supply bus 41 is connected to the integrated circuit terminal pad 51 to which a positive DC supply voltage $+V_{cc}$ is to be applied with respect to the pad 53 that is connected by the ground bus 55.

A bias current 57 flows through the four diodes 42, 44, 46 and 48 producing a voltage drop, $$V_{ds} = 4V_T \ln(I_{57}/I_0)$$

The term $V_T$ is the thermal voltage $KT/q$ which amounts to about 0.026 volts at room temperature, and $I_o$ is the reverse saturation current of the base-emitter junction. This voltage $V_{ds}$ is applied to the cathode of the principal photo diode 32 minus the base-emitter drop in emitter-follower transistor 35, and minus the drop across resistor 58.

A working prototype sensor was constructed. The areas of the photo diodes 32 and 40 are in the ratio of 20:1. Thus for any given ambient light intensity, the principal photo current 59 is twenty times larger and $$I_{59}/I_{57} = 20$$

The principal photo diode 32 is in a circuit loop including the four biasing diodes 42, 44, 46 and 48; the base-emitter junction of transistor 35; resistor 58; and the base-emitter junction periphery of transistor 39 is three times ($3\times$) greater (3 mils or 76 microns) than that of transistor 37 to provide in this current mirror stage a current gain of 3. Forgetting the resistor 58 for a minute, the reverse voltage $V_{pd}$ applied to the photo diode 32 is the four biasing diode drops minus the base-emitter junction drops of transistors 35, 38 and 37. By inspection of the circuit diagram of FIG. 5, this voltage $V_{pd}$ is a single $V_{BE}$. Assigning values $\beta_{17}=100$, $I_{59}=350\times10^{-9}$ amp. $I_0=10^{-16}$ amp., $V_{pd}=0.340$ volts. Resistor 36 has a value of 35,000 ohms and at $350\times10^{-9}$ amps. drops 0.012 volts. It merely serves as a safety device. Photo diode 32 occupies the relatively large area of 625 mils (0.4 mm$^2$) and the back voltage across it is kept low and substantially invarient with changes in power supply voltage ($V_{cc}$) and changes in light level, while the photo current 59 responds quickly to changes in light intensity. This circuit is described more fully in the patent application Ser. No. 344,449 filed simultaneously herewith entitled "Photo Sensor with Auxiliary Photo Diode Regulator".

A Darlington pair 62 of NPN transistors, 63 and 64 are connected in series with one output of the first current mirror stage, namely in the collector circuit of transistor 39. The base of Darlington pair 62 is connected to the diode string consisting of 44, 46 and 48, so that with reference to the ground bus 55, the bias voltage across this diode string amounts to 3 $V_{BE}$ drops (determined by auxiliary photo diode current 40) while the base of the Darlington pair 62 has the two $V_{BE}$ drops of transistors 63 and 64, respectively, to ground bus 55.

More quantitatively, it can be shown that the collector to emitter voltage established across output transistor 39 is the drop across one of the diodes 44, 46 or 48 minus a constant factor, i.e.

$$V_{CE39} = V_{BE44} - 0.1 \text{ volts.}$$

The very high current gain of the cascode connected Darlington pair 62 (typically $>10,000$) insures that very little Darlington base current will be needed and that the current 66 is essentially equal to current 60, especially at low light levels (low photo current levels) and low temperatures. The voltage clamping of the collector of current-mirror output transistor 39 further insures that for wide swings of the voltage appearing between busses 41 and 55 (e.g. when the light intensity changes from a low to a very high level), the current gain of the current-mirror stage is not affected and remains stable. The second current-mirror stage 70 is a PNP Wilson type having a unity current gain and, of course, exhibiting no Early-effect. The third current-mirror stage 72 is an NPN type, has a gain of 4 and has in the output branch a cascode connected Darlington pair 74. The fourth 76 and sixth 78 stages are unity-gain Wilson-type current-mirror circuits identical to the second stage 70. The fifth stage 80 is an NPN type with a gain of 4 and a cascode-connected Darlington pair 82. The seventh and last stage 84 is a current-mirror amplifier stage with multiple-transistors 86 in the output branch having their collectors tied together and emitters connected to the ground bus 55 some of which are made through fusable links 87 to provide a means for adjusting the gain of stage 84 in the manner described in the above noted patent, Ser. No. 296,748. Early effect in this last stage 84 is rendered innocuous by the cascode-connected Darlington pair 88 and the output is shorted to bus 41 in this two-terminal integrated-circuit photo sensor 30.

A diode string 90 is made up of three series-connected diodes 93, 94 and 95. The current 96 flows through the diode string 90. The Darlington pairs 74, 82 and 88 have their bases tied to this string 90 so that the voltage developed there by current 96 minus the two $V_{BE}$ drops in each of the Darlington pairs (e.g. 74) establishes a small and relatively invariant voltage at the collectors of the corresponding current-mirror output transistor (e.g. 73).

The first current-mirror stage 36 includes a second output transistor 97 having a standard base-emitter junction periphery ($1\times$) of 1 mil (25 microns) as do all transistors in FIG. 5 that are not otherwise designated. Thus the current 99 in the collector of this auxiliary output transistor 97 is equal to current 59 generated by the principal photo diode 32. A Darlington pair 101 in the collector circuit of transistor 97 prevents Early effect there. The base of Darlington pair 101, as is that of Darlington pair 62, is connected to the anode of diode 44. A unity gain PNP current mirror stage 103 produces the current 96 that equals currents 99 and 59.

The above described prototype sensor draws a power supply current 105 through terminals 51 and 53 that is directly proportional to photo current 59, and with no DC component. Thus in an ambient of total darkness, the supply current 105 is essentially zero.

This particular integrated circuit chip is designed to draw no more current 105 than about 8 milliamps. The supply current 105 as a function of light intensity is 20 $\mu$a/foot candle varying within the small range of $\pm 5\%$ from low to high light intensities. The voltage across terminals 51 and 53 may range from $+30$ down to $+2.7$ volts without losing this linearity between supply current amplitude and light intensity.

What is claimed is:

1. A linear two-terminal integrated circuit photo sensor comprising (a) a principal photo diode; (b) a current mirror amplifier including at least one current-mirror stage having a current gain of greater than one, said principal photo diode being connected in reverse current polarity to the input of said amplifier; (c) two terminal pads; (d) a conductive bus means for delivering electric energy from said two terminal pads to said principal photo diode and to said amplifier; (e) a separate bias means, comprising one string of series connected diodes, for establishing one bias current, derived from said two terminal pads, in a forward current direction through said one diode string that is directly proportional to the ambient light intensity and for making the amplitudes ratio of said one bias current to the output current from said at least one stage substantially less than unity; and (f) a cascoding transistor means having an input base connected to said one diode string and an output emitter cascode-connected to the output of said at least one current mirror stage for holding substantially constant the output voltage of said at least one current-mirror stage at a level directly related to the voltage established across said one diode string so that the branch currents of said current mirror amplifier and said bias means current through said one diode string contributes a power supply current that has essentially no DC component and is directly proportional to the ambient light intensity.

2. The photo sensor of claim 1 wherein said at least one stage is the input stage of said current mirror amplifier.

3. The photo sensor of claim 2 wherein said bias means further comprises:
an auxiliary photo diode of substantially smaller size than said principal photo diode, said auxiliary photo diode being connected in the reverse current direction in series with said one diode string, and
an emitter follower circuit having the input connected to the circuit point between said diode string and said auxiliary photo diode, said principal photo diode being connected between the emitter of said emitter follower and said input of said input stage.

4. The photo sensor of claim 3 wherein said input stage is made up of NPN transistors.

5. The photo sensor of claim 4 wherein said current mirror amplifier is comprised of a plurality of tandem connected current mirror stages that are alternately comprised of NPN and PNP transistors, respectively; said bias means additionally comprising another string of series connected diodes, other cascoding transistor means for holding substantially constant the output voltage of at least one other of said NPN stages than said input stage at a level directly related to the voltage established across said another diode string; said bias means being additionally for establishing a second bias current, derived from said two-terminal pads, in a forward current direction through said another diode string that is directly proportional to the ambient light intensity and for making the amplitudes ratio of said second bias current to the output current from said at least one other stage substantially less than unity.

6. The photo sensor of claim 5 wherein said other cascoding transistor means is additionally for holding substantially constant the output voltage of the remainder of said NPN stages at a level directly related to the voltage established across said another diode string, said bias means being additionally for making the amplitudes ratios of said second bias current to the output currents from each of said remainder stages, respectively, substantially less than unity.

7. The photo sensor of claim 1 wherein said current-mirror amplifier is comprised of a plurality of tandem connected stages that are alternately made up of NPN and PNP transistors, respectively, said at least one stage being other than the input stage of said current-mirror amplifier and being one of said NPN transistor stages, said bus means including a common bus and each gain-determining NPN transistor pair of each tandem connected stage having their emitters tied directly to said common bus, one end of said one diode string being also tied to said common bus, other cascoding transistor means for holding substantially constant the output voltages of those of said NPN transistor stages that follow said at least one stage at a level directly related to the voltage appearing at the other end of said one diode string.

8. The photo sensor of claim 7 wherein said PNP stages are of the Wilson-type.

9. The photo sensor of claim 5 wherein the input stage of said current mirror amplifier has a first output transistor with an output connected to the input of the second of said tandem connected stages and has a second output transistor whose base and emitter are connected respectively to the base and emitter of said first output transistor, said bias means further comprising a PNP current mirror circuit having its input connected to the output of said second output transistor and having its output connected to said another diode string to provide the light-proportional current therein.

10. The photo sensor of claim 9 wherein said input stage has an input transistor, said base-emitter junction areas of said input transistor and said second output transistor are equal; and wherein the current gain of said bias means PNP current mirror circuit is unity, so that said one bias current has a magnitude that essentially equals the light-generated photo current from said principal photo diode.

* * * * *

UNITED STATES PATENT AND TRADEMARK OFFICE
CERTIFICATE OF CORRECTION

PATENT NO. : 4,485,301
DATED : November 27, 1984
INVENTOR(S) : Walter S. Gontowski, Jr. et al It is certified that error appears in the above—identified patent and that said Letters Patent is hereby corrected as shown below:

Cover page, under "[56] References Cited - U.S. PATENT DOCUMENTS" the following U.S. patents should be listed:

| | | | |
|---|---|---|---|
| -- 4,085,411 | 4/1978 | Genesi | 354/51 |
| 4,199,753 | 4/1980 | Gontowski, Jr. | 340/555 |
| 4,216,379 | 8/1980 | Genesi | 250/214 -- |

Column 2, line 59, "heat room" should read -- head room --

Signed and Sealed this

Twenty-eighth Day of May 1985

[SEAL]

Attest:

DONALD J. QUIGG

Attesting Officer       Acting Commissioner of Patents and Trademarks